(12) United States Patent
Rinaldi

(10) Patent No.: US 7,978,583 B2
(45) Date of Patent: Jul. 12, 2011

(54) APPARATUS AND METHOD FOR FORMING REFLECTIVE LAYER OF OPTICAL DISC

(75) Inventor: Kenneth James Rinaldi, Madison Township, PA (US)

(73) Assignee: Cinram International Inc., Scarborough (CA)

( * ) Notice: Subject to any disclaimer, the term of this patent is extended or adjusted under 35 U.S.C. 154(b) by 1182 days.

(21) Appl. No.: 11/136,229

(22) Filed: May 24, 2005

(65) Prior Publication Data

US 2006/0270080 A1    Nov. 30, 2006

(51) Int. Cl.
*H01L 21/76* (2006.01)

(52) U.S. Cl. ......... 369/100; 438/29; 428/64.1; 118/720; 118/721; 118/504; 118/715; 156/345.3

(58) Field of Classification Search ............... 438/29; 118/721

See application file for complete search history.

(56) References Cited

U.S. PATENT DOCUMENTS

| | | | |
|---|---|---|---|
| 4,995,799 A | 2/1991 | Hayashi et al. | |
| 5,635,244 A * | 6/1997 | Mayeda et al. | 427/248.1 |
| 5,766,359 A | 6/1998 | Sichmann et al. | |
| 5,766,495 A | 6/1998 | Parette | |
| 5,792,538 A | 8/1998 | Yurescko-Suhan | |
| 5,800,687 A | 9/1998 | Kempf | |
| 5,863,328 A | 1/1999 | Sichmann et al. | |
| 5,863,399 A | 1/1999 | Sichmann | |
| 5,876,082 A | 3/1999 | Kempf et al. | |
| 5,879,121 A | 3/1999 | Kempf | |
| 5,900,098 A | 5/1999 | Mueller et al. | |
| 5,913,653 A | 6/1999 | Kempf | |
| 5,932,042 A | 8/1999 | Gensel et al. | |
| 5,932,051 A | 8/1999 | Mueller et al. | |
| 5,932,058 A | 8/1999 | Mueller | |
| 5,935,673 A | 8/1999 | Mueller | |
| 5,949,752 A | 9/1999 | Glynn et al. | |
| 5,958,651 A | 9/1999 | Van Hoof et al. | |
| 5,995,481 A | 11/1999 | Mecca | |
| 5,997,651 A * | 12/1999 | Matsuse et al. | 118/725 |
| 5,997,976 A | 12/1999 | Mueller et al. | |
| 6,054,029 A | 4/2000 | Kempf et al. | |
| 6,073,576 A * | 6/2000 | Moslehi et al. | 118/723 E |

(Continued)

OTHER PUBLICATIONS

"Singulus V Metallizer", 3 pages.

(Continued)

*Primary Examiner* — Joseph H Feild
*Assistant Examiner* — Ifedayo Iluyomade
(74) *Attorney, Agent, or Firm* — Cooper & Dunham LLP

(57) ABSTRACT

Improved techniques for forming a reflective layer of an optical disc are provided. One improvement includes forming the reflective layer over an information layer of the disc by utilizing a metallizer and a masking device having an angled lip configured to align to an outer edge of the information layer. The masking device allows the applied reflective layer to extend to the outer diameter edge of the information layer, and shields plasma generated by the metallizer from reaching internal components of the metallizer. The masking device may include a pusher having a spring mechanism attached to an inner masking portion of the masking device. When the disc and the pusher are brought into relative contact with each other by application of a first force to at least one of the masking device and the disc towards the other, the pusher is spring-loaded and is pushed up into a recess of the inner masking portion, and when the first force is removed, the spring-loaded force of the pusher pushes the disc away from the masking device.

20 Claims, 6 Drawing Sheets

U.S. PATENT DOCUMENTS

| | | | |
|---|---|---|---|
| 6,096,180 A | 8/2000 | Sichmann | |
| 6,117,284 A | 9/2000 | Mueller | |
| 6,124,011 A | 9/2000 | Kern | |
| 6,160,787 A | 12/2000 | Marquardt, Jr. et al. | |
| 6,261,403 B1 | 7/2001 | Gerigk et al. | |
| 6,264,804 B1 * | 7/2001 | Lee et al. | 204/192.12 |
| 6,309,496 B1 | 10/2001 | Van Hoof | |
| 6,309,727 B1 | 10/2001 | Mueller et al. | |
| 6,361,845 B1 | 3/2002 | Kern | |
| 6,368,435 B1 | 4/2002 | Kempf | |
| 6,440,248 B1 | 8/2002 | Mueller | |
| 6,527,538 B1 | 3/2003 | Pickutoski et al. | |
| 6,814,825 B2 | 11/2004 | Becker et al. | |
| 7,325,287 B2 | 2/2008 | Sweeney | |
| 7,419,045 B2 | 9/2008 | Kelsch | |
| 7,535,806 B2 | 5/2009 | Fumanti | |
| 7,564,771 B2 | 7/2009 | Sweeney | |
| 2006/0023598 A1 | 2/2006 | Babinski et al. | |
| 2006/0101634 A1 | 5/2006 | Sweeney | |
| 2006/0104190 A1 | 5/2006 | Babinski | |
| 2006/0165419 A1 | 7/2006 | Musto | |
| 2006/0181706 A1 | 8/2006 | Sweeney | |
| 2006/0222808 A1 | 10/2006 | Pickutoski et al. | |
| 2006/0274617 A1 | 12/2006 | Musto et al. | |
| 2007/0008861 A1 | 1/2007 | Fumanti | |
| 2007/0014224 A1 | 1/2007 | Sweeney | |
| 2007/0029167 A1 | 2/2007 | Kelsch | |
| 2007/0090006 A1 | 4/2007 | Kelsch | |
| 2007/0098947 A1 | 5/2007 | Mueller | |

OTHER PUBLICATIONS

U.S. Appl. No. 11/705,682, filed Feb. 13, 2007.
U.S. Appl. No. 11/715,249, filed Mar. 6, 2007.
U.S. Appl. No. 11/726,968, filed Mar. 22, 2007.
U.S. Appl. No. 11/705,682, filed Feb. 13, 2007 of Michael Parette.
U.S. Appl. No. 11/715,249, filed Mar. 6, 2007 of William R. Mueller et al.
U.S. Appl. No. 11/726,968, filed Mar. 22, 2007 of Lewis Gensel et al.
U.S. Appl. No. 11/936,625, filed Nov. 7, 2007 of Petrus Hubertus Van Hoof et al.
U.S. Appl. No. 11/938,572, filed Nov. 12, 2007 of Dominick A. Dallaverde et al.
U.S. Appl. No. 12/126,667, filed May 23, 2008 of Ed Pickutoski.
U.S. Appl. No. 12/567,886, filed Sep. 28, 2009 of James J. Musto et al.

* cited by examiner

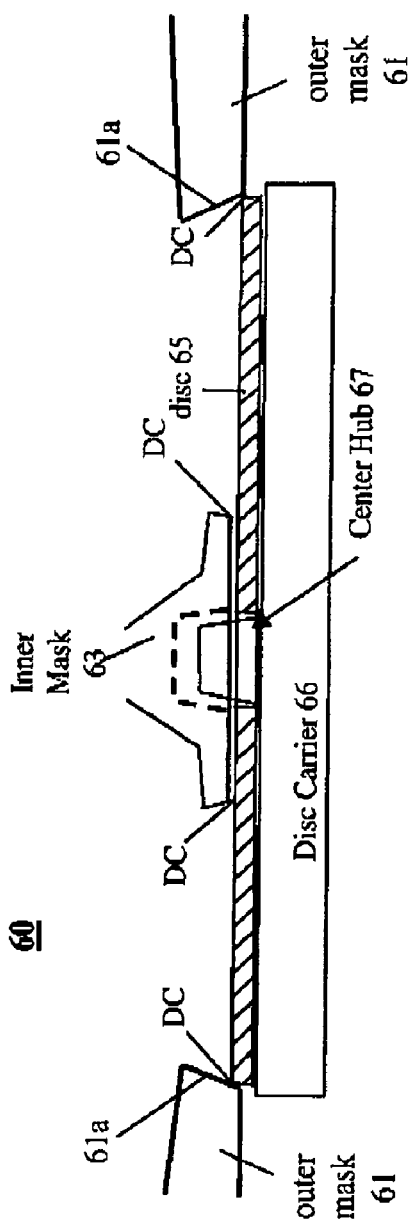
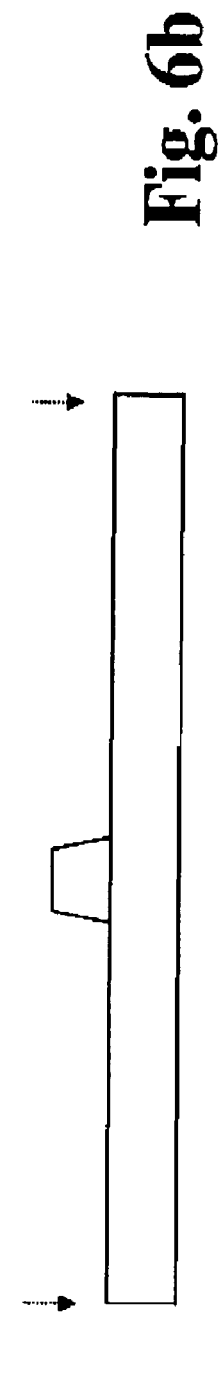
Fig. 6a
Fig. 6b

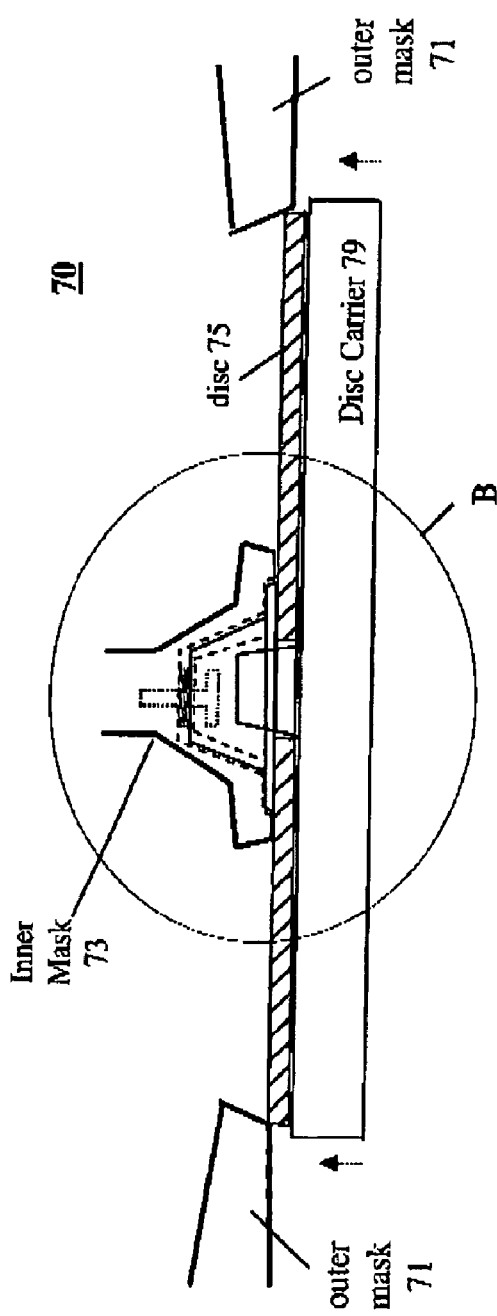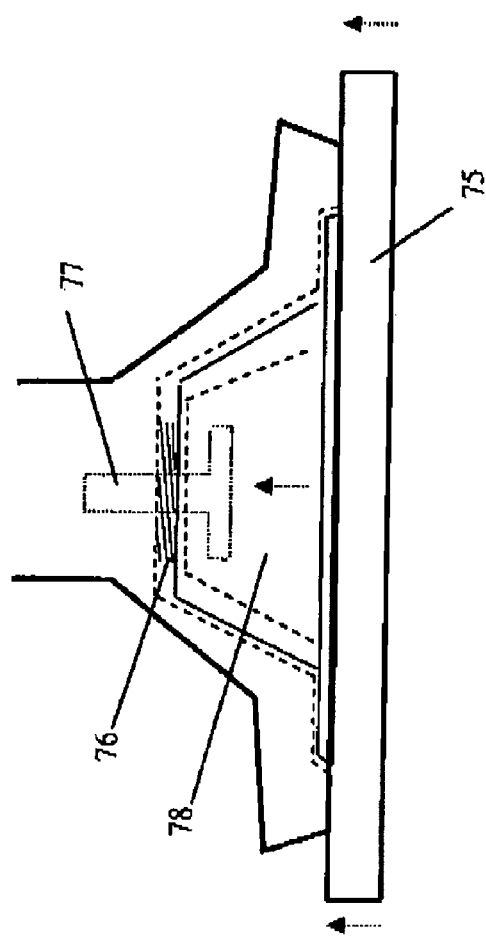

APPARATUS AND METHOD FOR FORMING REFLECTIVE LAYER OF OPTICAL DISC

TECHNICAL FIELD

This application relates to methods, apparatuses and systems for manufacturing optical storage media. In particular, the application relates to improved techniques for forming a reflective layer of an optical disc.

DESCRIPTION OF RELATED ART

Use of CDs (compact discs) and DVDs (digital versatile discs or digital video discs) as optical storage media ("optical disc") for storing and transporting content (such as audio, video, graphics, computer software, etc.) in an optically readable manner has been popular for a number of years. Several formats of optical discs are currently available, including (A) read-only formats such as CD-DA (digital audio compact disc), CD-ROM (CD-read-only memory), DVD-ROM, and other formats wherein content is prerecorded on the disc (such as by using an injection molding process), and (B) recordable formats in the form of (i) write-once read-many times formats such as CD-R (CD-recordable), and DVD±R (DVD-recordable), etc., or (ii) rewritable formats such as CD-RW (CD-rewriteable), DVD-RAM (DVD-Random Access Media), DVD-RW or DVD+RW (DVD-rewriteable), PD (Phase change Dual disk) and other phase change optical discs. Optical disc players for these optical discs use a red laser. Optical discs using a blue laser have also been introduced, such as HD DVD and BD (each of which includes read-only, recordable and rewritable formats). In addition, hybrid optical media which include a combination of formats are also available.

In conventional read-only type optical discs (for example, CD-ROM, DVD-ROM, etc.), data is generally stored as a series of "pits" embossed in a plane of "lands". Microscopic pits formed in a surface of a plastic medium [for example, polycarbonate or polymethyl methacrylate (PMMA)] are arranged in tracks, conventionally spaced radially from the center hub in a spiral track originating at the medium center hub and ending toward the medium's outer rim. The light reflected from a read-only medium's surface by an optical disc player or reader varies according to the presence or absence of pits along the information track. A photodetector and other electronics inside the optical disc player translate the signal from the transition points between these pits and lands caused by this variation into the 0s and 1s of the digital code representing the stored information.

Read-only type optical discs generally are produced by an injection molding process. Initially, data representing the content to be recorded, encoded as a run length limited digital code (commonly known as an EFM signal in CD manufacturing) which contains its digital information in the timing between transitions, is used to control a laser beam recorder to form pits in a photoresist or a dye-polymer layer on an optical grade glass disc known as a glass master. A metallized glass master is used in an electroforming process to form (typically, metal) stampers. A stamper is used on one side of an injection molding cavity to emboss an information layer of pits and lands on a transparent polymer substrate formed by injection molding. The information bearing surface of the substrate is then covered with a reflective film (of metal or alloy) or the like. In the case of a CD, a plastic protective coating is applied over the film, and then art (for example, a picture, a design, text, etc.) is typically printed on the upper surface of the disc, to form an end product. In the case of DVDs, two half-thickness substrates are typically formed, metallization is applied to one (for example, DVD-5) or both (for example, DVD-10, DVD-9, DVD-18) half-thickness substrates, and the two half-thickness substrates are bonded by an adhesive (for example, hotmelt adhesive, ultraviolet light-cured adhesive, etc.). A second information layer can be formed for a DVD (for example, DVD-18) by applying a photo-polymer coating over a metallization layer applied to a substrate and the second information layer is embossed by a stamper into the photo-polymer layer which is then UV cured, metallized and protective coated.

Recordable type optical media typically include a spiral wobble groove in the substrate. The groove defines recording channels on the disc for recording data, provides information for tracking of the disc while writing or reading data, and has its wobble frequency modulated to contain addressing and other information for the write and read processes. The substrate (including information layer bearing the spiral wobble groove) can be formed by injection molding, using a stamper electroformed with a glass master. In addition, recordable-type optical media generally include a recording layer, and in addition a reflective layer (of metal or alloy) and a protective layer. Information is recorded in the recordable-type optical medium by directing a laser light beam modulated by signals to selectively change optical characteristics (reflectivity or extinction coefficient) of the recording layer. The recording layer in write-once read-many times optical media typically includes a photosensitive organic dye which is heated during recording to irreversibly to form a pattern of marks or pits into the recording layer.

Each recording side of a rewritable disc also uses multiple layers beginning with a polycarbonate plastic substrate containing a shallow spiral groove extending from the inside to the outside diameter of the disc. A DVD-RW disc may additionally include pits and lands and a DVD-RAM disc also inside the groove itself. The substrates (including information layer bearing the spiral groove, land pre-pits and embossed areas) may be formed by injection molding, using a stamper electroformed with a glass master. Next in the multiple layers of a rewritable disc typically comes a dielectric layer, followed by a phase-change type recording layer having a polycrystalline structure, another dielectric layer and a reflective layer (of metal or alloy). Additional layers may also be incorporated above or below the dielectric layer, with a protective coating being applied as a last layer. During recording of the rewritable optical medium, the laser selectively heats tiny areas of the recording track to change the phase of each heated area from more crystalline into less crystalline (also known as "amorphous") phase, in order to create marks that can be called "pits". During erase, the laser (in a process called "annealing") changes the amorphous areas back into more crystalline areas.

Various types of hybrid optical media are available. For example, one type of hybrid media has data pit patterns prerecorded on a surface of a substrate and has in addition a recording layer allowing a user to record data to the recording layer. Further, optical recording media having multiple recording layers are now also available. In addition, in another hybrid optical recording disc a read-only area and a recordable area are present on one side of the hybrid optical disc, with a wobble groove in the read-only area modulated by depressions in the substrate and extending into the substrate in the recordable area. Each of the hybrid optical media has one or more reflective films (of metal or alloy) or the like.

In each of the different types of optical media, the reflective film or layer is typically applied in optical disc manufacturing by a sputtering device. A masking device is used when the reflective layer is sputtered. Conventional optical disc manufacturing methods use an outer mask when applying the metal reflective cover layer over the data area of the disc, to limit the application of the metal reflective cover by leaving a non metal area around the outer edge of the disc. The result is a clear outer area that is visible along the full outer diameter of the disc. Variations in the alignment of the disc when this layer is applied can lead to non symmetrical coverage and can affect playability on discs with full data capacity reaching the outer edge area.

Conventional manufacturing methods typically also use an inner mask when applying a reflective cover layer over the data area of the disc. The inner mask masks the inner part of the disc so that no reflective layer is applied in that area. In the metallization process (that is, application of a reflective cover layer on an optical media disc), the disc is pushed up against the inner mask and outer mask during the application of the reflective layer. After the reflective layer is applied, the disc is generally lowered away from the masks. However, in many instances the disc sticks to the masks and causes jams within the metallizer, thus leading to downtime and possibly even damage to internal components of the metallizer equipment. Some metallizer equipment utilizes a retaining mechanism that holds the inner hole of the disc so the disc does not fall off and jam the metallizer. However, if the grabber/retaining mechanism is not property aligned, it also can cause jamming problems.

There is a need for improvements to the techniques for applying the reflective layer.

SUMMARY

This application discusses improvements to methodologies and apparatuses for producing optical discs.

For example, an improved masking device, in an exemplary embodiment, for use with a metallizer to form a metal reflective layer of an optical disc, includes an outer masking portion having an angled lip configured to align to an outer edge of the disc. The outer masking portion having the angled lip allows the metal reflective layer applied by the metallizer to reach an outer diameter edge of the information layer, and the masking device shields metal plasma generated by the metallizer from reaching internal components of the metallizer.

According to another exemplary embodiment, a masking device for use with a metallizer to form a metal reflective layer of an optical disc includes a pusher having a spring mechanism attached to an inner masking portion body of the masking device configured to shield an inner portion of the disc surface when the inner masking portion sits on the inner portion of the disc surface during application of the metal reflective layer by the metallizer. When the disc and the pusher are brought into relative contact with each other by application of a first force to at least one of the masking device and the disc towards the other, the pusher is pushed up into a recess of the inner masking portion body, and when the first force is removed, the spring-loaded force of the pusher pushes the disc away from the masking device.

An apparatus for forming a metal reflective layer of an optical disc includes, in an exemplary embodiment, a metallizer and a masking device. The metallizer applies the metal reflective layer over an information layer of the disc. The masking device includes an outer masking portion having an angled lip configured to align to an outer edge of the disc. The outer masking portion having the angled lip allows the metal reflective layer applied by the metallizer to reach an outer diameter edge of the information layer, and the masking device shields metal plasma generated by the metallizer from reaching internal components of the metallizer.

According to another exemplary embodiment, an apparatus for forming a metal reflective layer of an optical disc includes (i) a metallizer for applying the metal reflective layer of the disc, and (ii) a masking device including a pusher having a spring mechanism attached to an inner masking portion of the masking device body configured to shield an inner portion of the disc surface when the inner masking portion sits on the inner portion of the disc surface during application of the metal reflective layer. When the disc and the pusher are brought into relative contact with each other by application of a first force to at least one of the masking device and the disc towards the other, the pusher is spring-loaded and is pushed up into a recess of the inner masking portion body. When the first force is removed, the spring-loaded force of the pusher pushes the disc away from the masking device.

A method for forming a metal reflective layer of an optical disc, in one embodiment, includes (a) positioning a masking device including an outer masking portion having an angled lip to align the angled lip to an outer edge of an information layer of the disc, and (b) using a metallizer to form the metal reflective layer over the information layer. The metal reflective layer extends to the outer diameter edge of the information layer, and the masking device shields metal plasma generated by the metallizer from reaching internal components of the metallizer.

Thus, an improved optical disc can be produced using the techniques of this application. The improved optical disc comprises an information layer and a metal reflective layer extending to an outer edge of the information layer uniformly around a circumference of the information layer.

BRIEF DESCRIPTION OF THE DRAWINGS

The features of the present application can be more readily understood from the following detailed description with reference to the accompanying drawings wherein:

FIG. 3b shows an exploded view of section A in FIG. 3a;

FIG. 6a shows a schematic diagram of a portion of an apparatus for forming a reflective layer of an optical disc, with an outer mask having an angled lip which is aligned with an outer edge of a disc, and with an inner mask not adapted to overcome disc sticking;

FIG. 6b shows the apparatus of FIG. 6a with the disc carrier having been moved away from the masks, and with the disc sticking to the masks;

FIG. 7a shows a schematic diagram of a portion of an apparatus for forming a reflective layer of an optical disc, according to another exemplary embodiment of this application;

FIG. 7b shows an exploded view of section B in FIG. 7a;

FIG. 8b shows an exploded view of section C in FIG. 8a.

DETAILED DESCRIPTION

This disclosure describes improvements to methodologies and apparatuses for producing optical discs which can avoid damage to internal components of metallization equipment and which can overcome disc sticking from the process of applying a reflective layer.

Figure 1:
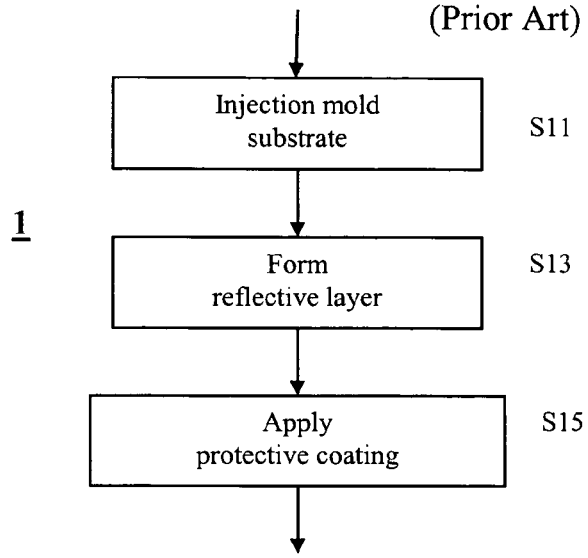
FIG. 1 shows a flow chart of a conventional optical disc manufacturing method.

A method 1 for producing an optical disc will be described with reference to FIG. 1. A substrate is injection molded to have an information layer in the form of pits and lands (step S11). A reflective layer (for example, aluminum, gold, silver, Ag alloy, etc.) is then formed over the information layer (step S13). A protective coating is applied to the side of the disc (step S15). In the case of a CD, the reflective layer is typically applied by sputtering a layer of metal or alloy over the information layer.

In the case of a DVD disc, two half-thickness substrates are bonded together with an adhesive. If the DVD is to have only a single information layer, then the second substrate may be a blank (i.e. does not include an information layer bearing pits and lands or metallization). If the DVD is to have two information layers, two single-layer substrates may be bonded together. If reading is to take place from only one side, one of the reflective layers is less reflective. If reading is to take place from both sides, then both reflective layers can be equally reflective.

Methodologies and apparatuses which can be used in an optical disc manufacturing process are discussed in U.S. Pat. Nos. 4,995,799, 5,766,495, 5,792,538, 5,863,328, 5,900,098, 5,913,653, 5,932,042, 5,932,051, 5,932,058, 5,935,673, 5,949,752, 5,958,651, 5,995,481, 5,997,976, 6,117,284, 6,124,011, 6,160,787, 6,309,496, 6,309,727, 6,361,845, 6,440,248, 6,527,538, which are incorporated by reference herein in their entireties. Additional apparatuses and techniques are discussed in U.S. Pat. Nos. 5,766,359, 5,800,687, 5,863,328, 6,261,403 and 6,814,825, which are also incorporated by reference herein in their entireties.

A system 10 for producing optical discs will be described with reference to FIG. 2. The system 10 is an-line system for producing double-surfaced optical discs (such as a DVD or HD disc). Each double-surfaced optical disc has an upper surface (which may be information bearing or not) and a lower information bearing surface and with each information bearing surface being formed by injection molding a polycarbonate plastic surface having a pattern of pits and lands and by coating the pits and lands with a metallic reflective coating.

In the system 10 an injection molding station 11 injects a molten transparent polycarbonate plastic into a mold cavity, having a stamper on one face to produce a clear plastic disc with pits impressed on one side. The molded plastic disc is placed by a robotic arm 12a in a carousel 17 which rotates to bring the disc to the metallization station 13 where the disc is lifted by a robotic arm 12b and brought into the metallization station 13, coated upon the pitted surface of the disc with a reflective layer and returned to the carousel 17. Where the surface is not information bearing it would not require a metallization step. The half disc travels upon disc transport belts 15 during which time it cools somewhat. The corresponding upper disc half waits upon a spindle (not shown) for assembly. The lower disc half is moved by a robotic arm (not shown) from the transport belt 15 to a rotation station 23. A fluid dispensing arm 19 places a ring of an ultra-violet curable adhesive on the lower half disc as it is slowly rotated through a full rotation on a spacer chuck. A robotic arm (not shown) then removes the upper half disc from the spindle and places it upon the spacer chuck, so that it does not contact the adhesive.

Figure 2:
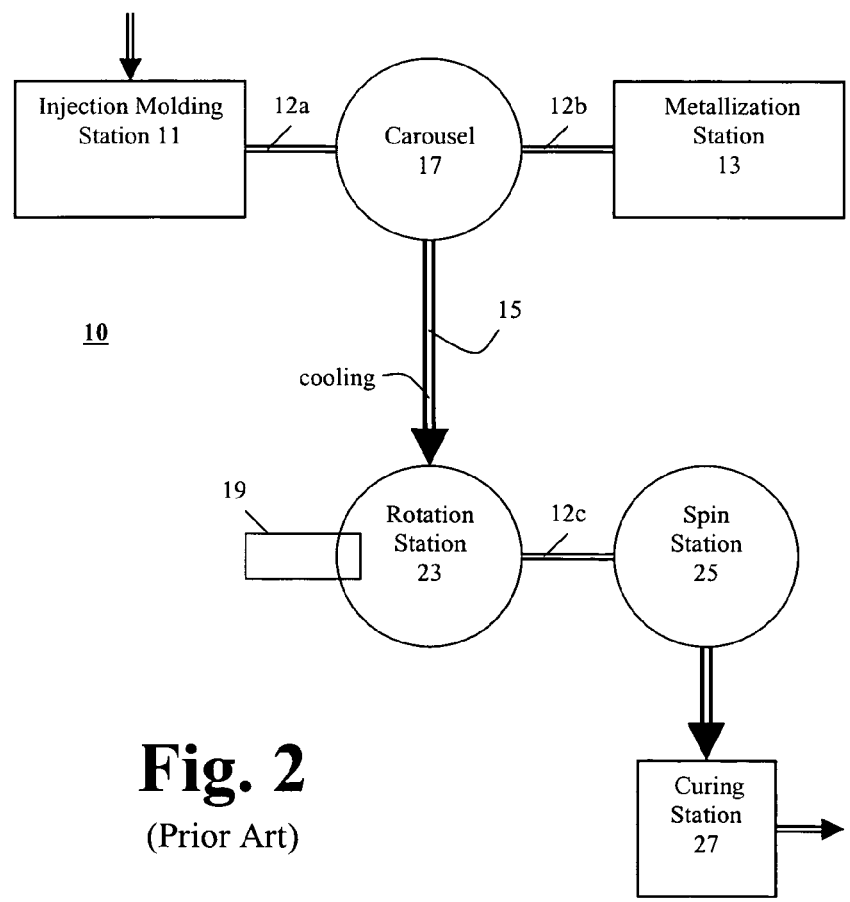
FIG. 2 shows a schematic diagram of a conventional optical disc producing system.

In the case of a process for manufacturing optical discs in which only one surface is information bearing, only a single injection molding station 11 and a single metallization station 13 (such as shown in FIG. 2) are needed to be included. On the other hand, in a process for manufacturing optical discs in which both surfaces are information bearing, two injection molding stations and two metallization stations (not shown) would typically be included, and a transport mechanism brings the two half-discs to an assembly area where adhesive is applied to one of the discs.

Next, the pair of discs is lifted by a robotic arm 12c to a spin station 25 where the upper surface comes into contact with the adhesive and the sandwich of discs and adhesive is rapidly spun to spread the adhesive. The composite is then transported to a curing station 27 where the composite is exposed to ultra-violet light of low intensity adjusted so that primarily the inner and outer circumferences of the disc halves are bonded. If the disc has a metallization layer that does not extend to either the internal or external radii of the disc, it is sufficient to bathe the entire disc in ultra-violet radiation and rely mainly upon the shielding by the metallization layer to effect the tacking of the surfaces together at their inner and outer circumferences. The composite is exposed to sufficient ultra-violet light to cure the adhesive.

The above-mentioned method 1 and system 10 are merely one conventional method and one conventional system, respectively, amongst many conventional methods and conventional systems which can be modified according to the present disclosure. For example, other conventional methodologies and systems for manufacturing read-only type optical media using injection molding (or other molding techniques) can also be adapted according to this disclosure. This disclosure is not limited to production of read-only type optical discs. Methodologies and systems for making recordable, rewritable and/or hybrid optical media utilizing a molding technique can also be modified to obtain the benefits of this disclosure.

When applying a reflective cover layer on the data area of an optical disc, conventional approaches do not allow the reflective layer to reach the outer edge of the disc, and do not provide symmetrical coverage of the metal layer. Conventional methods use a masking device to mask the outer edge of the optical disc during application of the reflective cover layer, and thereby leaves a clear area along the outer diameter of the disc. If the disc and the masking device are not properly aligned, the mask can potentially mask into the data area, causing playability issues on maximum data capacity discs.

An improved technique for applying a reflective layer, according to one feature of this application, allows full coverage of a reflective layer to an outer edge of an optical disc. In particular, an outer mask having an angled lip is used in a metallizer. The improved masking device allows the optical disc to align with the mask and allows a reflective cover layer covering the disc data area to extend to an outer edge of the disc.

The angled edge aligns and seals the disc to the outer mask. The seal restricts flow of plasma generated during this process beyond the disc/mask area. Since the improved masking device allows the disc to seal to the angled edge of the outer masking device, plasma generated from the metallization process is limited to the exposed disc surface, thus protecting the internal components of the metallizer.

Figure 3A:
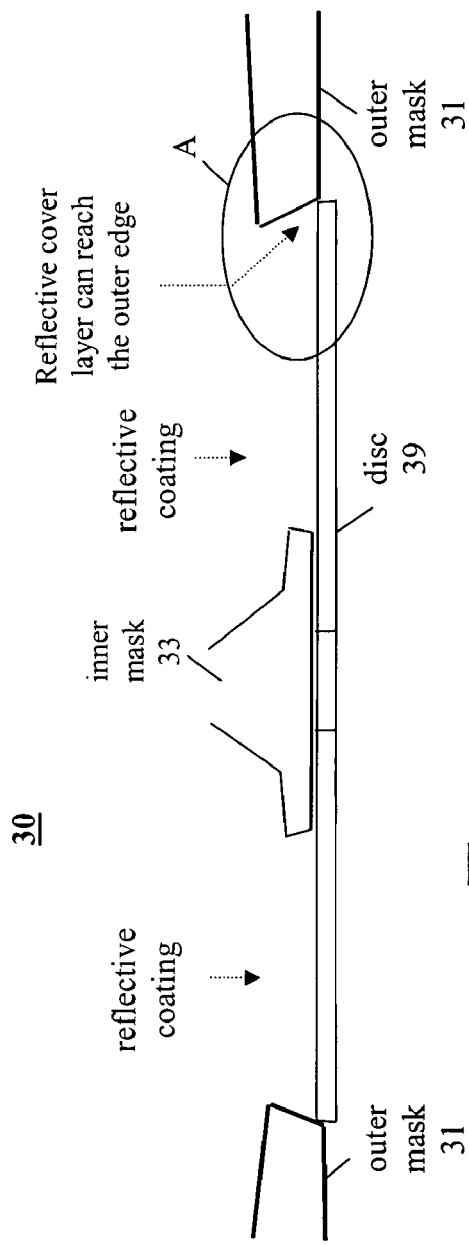
FIG. 3a shows a schematic diagram of a portion of an apparatus for forming a reflective layer of an optical disc, according to an exemplary embodiment of this application.
Figure 3B:
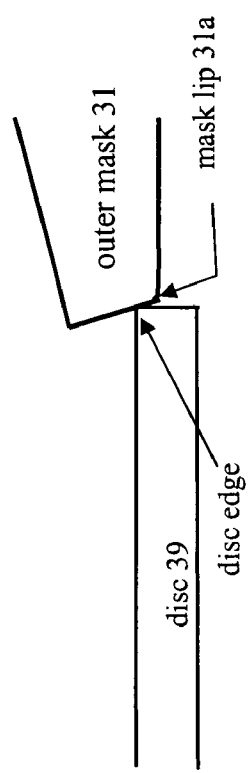

An exemplary embodiment is discussed below with reference to FIGS. 3A and 3B.

An apparatus for forming a reflective layer of an optical disc can comprise (i) a metallizer (not shown) for applying the reflective layer over an information layer of the disc, and (ii) a masking device 30 including an outer masking portion 31 having an angled lip 31a configured to align to an outer edge of the disc. The outer masking portion 31 having the angled lip 31a allows the reflective layer applied by the metallizer to reach an outer diameter edge of the disc or information layer. The masking device 30 shields plasma generated by the metallizer from reaching internal components of the metallizer. The masking device 30 can optionally include an inner masking portion 33.

A reflective layer applied by the metallizer with use of the improved outer masking device can (a) cover an entire data area side of the information layer, and/or (b) form symmetrically over the entire information layer. In addition, the improved outer mask allows the optical disc to be self-centering and receive full symmetrical coverage of the reflective layer to the outer edge of the disc.

Self centering facilitates long play selections (for example, greater that the seventy-four minutes of standard play CD). Since the data is closer to the edge for extended playtime selections, a reflective layer extending close to the edge can ensure playability. If the disc is not centered, the reflective layer will not be eccentric along the outer edge and in many instances there will be areas along the edge where there is no reflective material. This can be attributed to a misaligned or worn mechanism within the metallizer. Self centering ensures eccentric reflective layer application even if the mechanism is worn or misaligned.

The improved masking device can be used in a system for manufacturing prerecorded optical discs, recordable optical discs, rewritable optical discs or hybrid optical discs.

Figure 4:
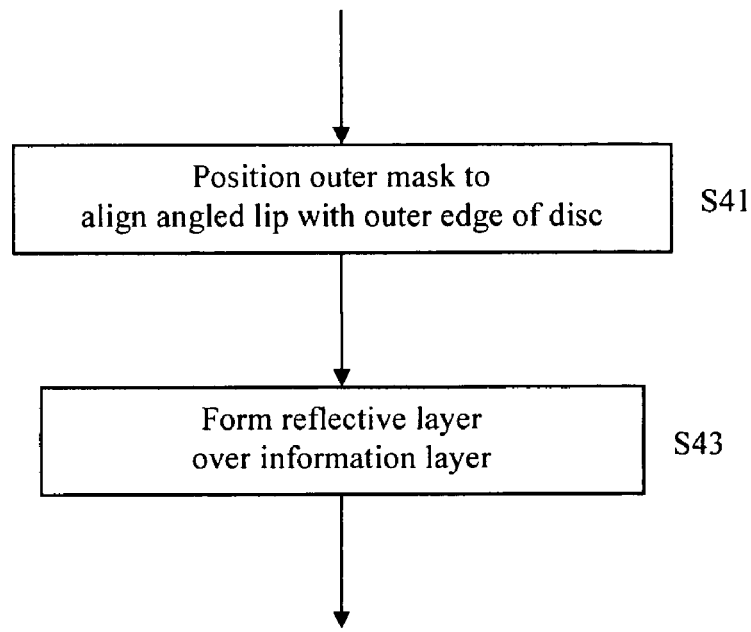
FIG. 4 shows a flow chart corresponding to a method for forming a reflective layer of an optical disc, according to an exemplary embodiment.

A method for forming a reflective layer of an optical disc, according to an exemplary embodiment, is discussed below with reference to FIGS. 3a and 4. The outer masking portion 31 of the masking device 30 is positioned to align the angled lip 31a to an outer edge of the disc (step S41). The metallizer is operated to form a reflective layer over the information layer of the disc (step S43). If the angled lip of the outer masking portion is aligned with the disc edge, the reflective layer deposited by the metallizer extends to the outer diameter edge of the information layer, and the masking device shields plasma generated by the metallizer from reaching internal components of the metallizer. When the angled lip of the masking device is aligned to the outer diameter edge of the disc, plasma does not substantially pass between the angled lip and the outer diameter edge of the information layer. This method can be applied in a process for manufacturing read-only type optical discs, recordable optical discs, rewritable optical discs or hybrid optical discs.

Figure 5:
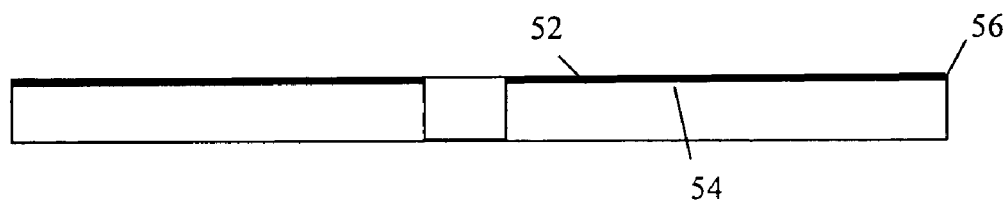
FIG. 5 shows a partial view of a disc including substrate bearing information layer, and a reflective layer, according to an exemplary embodiment.
Figure 8A:
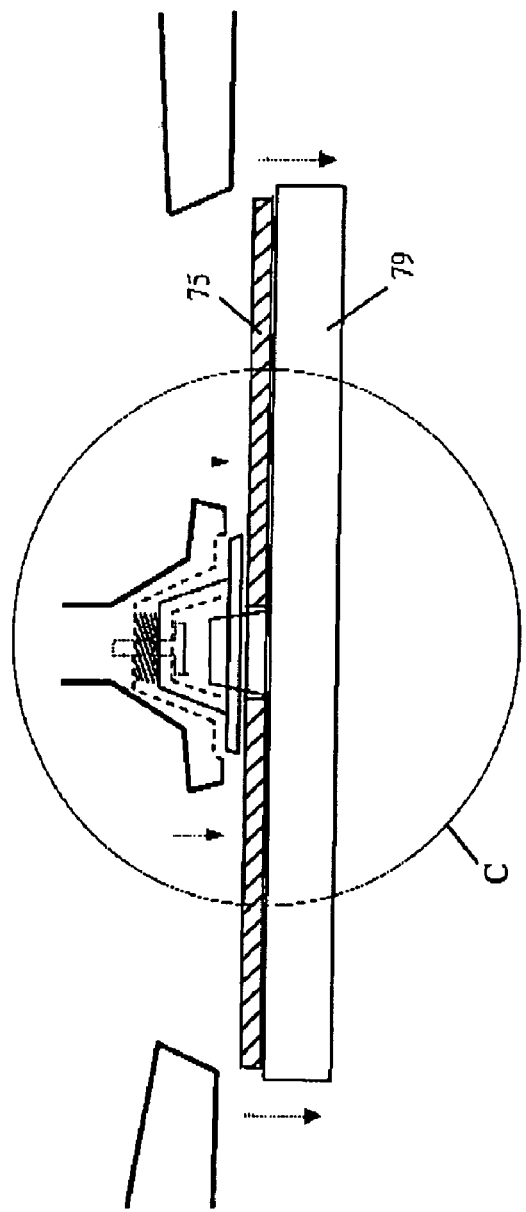
FIG. 8a shows the apparatus of FIGS. 7a and 7b with the disc carrier having been moved away from the masks, and with the disc being pushed away from the masks by the pusher.
Figure 8B:
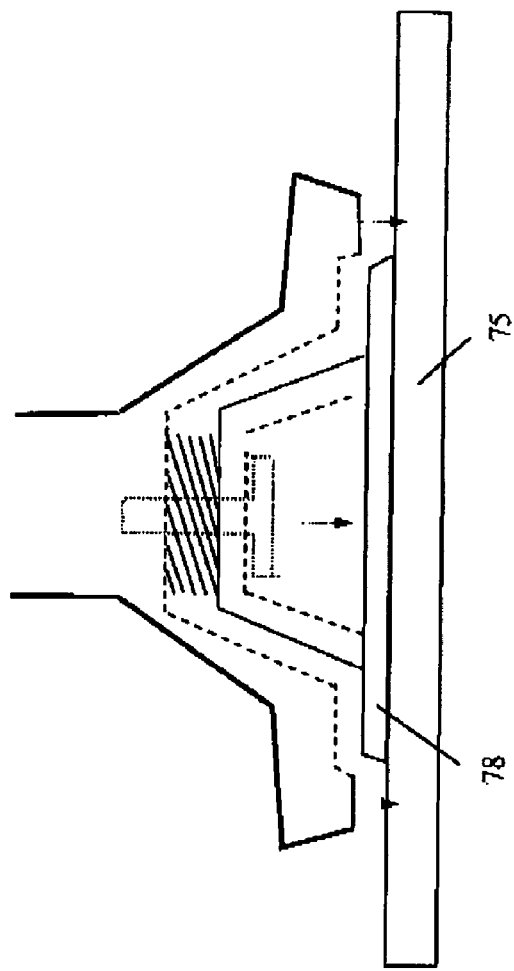

Thus, an improved optical disc 50 can be formed, comprising an information layer 54 and a reflective layer 52 extending to an outer edge 56 of the disc uniformly around a circumference of the information layer. The reflective layer can cover an entire data area of the information layer and can be formed symmetrically over the information layer. The improved optical disc can be a read-only type disc, a recordable disc, a rewritable disc or a hybrid disc. While the reflective layer is adjacent to the information layer in the exemplary disc shown in FIG. 5, one or more additional layers can of course be interposed between a reflective layer and an information layer in other types of optical discs that can be formed using the techniques of this application (such as recordable optical discs, rewritable optical discs, hybrid optical discs, etc.).

According to another embodiment, the masking device can have an improved inner masking portion.

An inner masking device is often used to mask an inner area of the optical disc during application of a reflective cover layer, and leaves a clear area from the center hole through the clamping area of the disc. There is a tendency in some metallizers for the disc to stick to the mask after metallization.

For example, operation of a masking apparatus without adaptation to overcome disc sticking is graphically portrayed in FIGS. 6a and 6b. Apparatus 60 includes outer mask 61 and inner mask 63. The outer mask 61 has an angled lip 61a. The outer mask 61 and inner mask 63 may commonly be attached to a frame (not shown) and positioned such that as the frame is brought in a direction towards a disc carrier 66 on which sits a disc 65 centered around a center hub 67, the inner mask 63 contacts an inner portion of the disc 65 at approximately the same time that the outer mask 61 is aligned with the outer edge of the disc 65 (FIG. 6a).

While the masks are in a position of alignment, a reflective layer is sputtered by a metallizer (not shown). After the reflective layer is formed, the disc carrier (bearing the center hub) and the masks are moved away from each other. This movement can include (i) moving the masks in a direction away from the disc carrier and/or (ii) moving the disc carrier away from the mask. In any event, it is intended that the disc remain on, and move along with, the disc carrier. However, as a matter of practice, the disc often adheres to the masks even when the disc carrier is moved away (FIG. 6B). There is a tendency for sputtered material to accumulate near the points DC of contact as between the disc and the masks, causing internal jamming and downtime when an automated process is used.

A disc release push off mechanism can be used to eliminate disc jams within the metallization process. An improved inner masking device configured to shield an inner portion of a disc surface when the inner masking device sits on the inner portion of a disc surface during application of a reflective layer by a metallizer, according to an exemplary embodiment, includes a pusher having a spring mechanism attached to an inner masking portion body of the masking device. When the disc and the pusher are brought into relative contact with each other by application of a first force to at least one of the masking device and the disc towards the other, the pusher is pushed up into a recess of the inner masking portion body and the spring becomes compressed. When the first force is removed, the spring-loaded force of the pusher pushes the disc away from the masking device, thereby overcoming sticking of the disc to the masks from any type of metallization process. When the masking device is not resting on the disc surface, a lower portion of the pusher protrudes from an under side of the masking device body.

The disc release push off mechanism can include a hat shaped spring loaded modification to an inner masking device, as discussed below with reference to FIGS. 7a through 8b. In apparatus 70, a spring mechanism 76 is recessed up into an inner mask housing 73 and is secured on one end by a shoulder type screw 77 to the inner mask housing 73. The other end of the spring 76 sits flush against the top of a hat-shaped pusher 78 having a flat bottom surface. The bottom part of the pusher 78 protrudes from the under side of the inner mask 73.

When a disc 75 is moved (along with a disc carrier 79) up to the bottom part of the pusher 78, the bottom part of the pusher 78 is pushed up into the inner mask housing 73, compressing the spring 76 (FIGS. 7a and 7b).

After a reflective layer is applied and the disc carrier is moved away from the mask, the disc pusher 78 with the spring loaded force pushes the disc away from the mask (FIGS. 8a and 8b) and overcomes sticking of the disc to the masking device, thereby avoiding the risk of jams within the metallizer in an automated process. The spring force is a positive force. The spring mechanism can include any type of compression spring(s) that creates a positive outward/downward force which pushes the bottom surface of the pusher mechanism downward.

Conventional metallizes equipment (for example, FIGS. 6a and 6b) typically does not include devices for retaining the disc 65 to the disc carrier 66, and does not provide self centering masking. Application of the reflective cover led to discs sticking to the masking within conventional metallizer equipment, thereby causing jamming within the metallizer. The jamming caused equipment downtime, and sometimes damage to internal parts of the equipment. For example, jamming may cause 5% (or more) of the total downtime per month. The addition of the pusher mechanism reduced downtime to 0.03% of the total per month.

The above specific embodiments are illustrative, and many variations can be introduced on these embodiments without departing from the spirit of the disclosure or from the scope of the appended claims. Elements and/or features of different illustrative embodiments may be combined with each other and/or substituted for each other within the scope of this disclosure and appended claims.

For example, although a sputtering process is mentioned exemplarily as being used for applying the reflective layer, it should be understood that the subject matter of this application can be used even if other techniques for applying the reflective layer are used. Further, although the terms "metallization", "metallizer", etc. are used exemplarily in the discussion of exemplary embodiments above, it should be understood that the scope of this application and appended claims is not limited to use with application of a metal reflective layer, but can be used for application of a reflective layer of alloy and/or other materials as well.

What is claimed is:

1. An apparatus for forming a reflective layer of an optical disc comprising an information layer and the reflective layer, the apparatus comprising:
   a metallizer for applying the reflective layer over the information layer of the optical disc;
   a masking device including an outer masking portion having an angled lip configured to align to an outer edge of the optical disc,
   wherein the outer masking portion having the angled lip allows the reflective layer applied by the metallizer to reach an outer diameter edge of the information layer, and
   wherein the angled lip allows the optical disc to seal to the angled lip, and the masking device shields plasma generated by the metallizer from reaching internal components of the metallizer.

2. The apparatus of claim 1, wherein the reflective layer applied by the metallizer covers an entire data area side of the information layer.

3. The apparatus of claim 1, wherein the reflective layer applied by the metallizer is formed symmetrically over the entire information layer.

4. The apparatus of claim 1, wherein one or more additional layers are interposed between the reflective layer of the optical disc and the information layer.

5. A system for manufacturing one or more of prerecorded optical discs, recordable optical discs, rewritable optical discs and hybrid optical discs, said system including the apparatus of claim 1.

6. A masking device for use with a metallizer to form a reflective layer of an optical disc, the masking device including an outer masking portion having an angled lip configured to align to an outer edge of the optical disc, wherein the outer masking portion having the angled lip allows the reflective layer applied by the metallizer to reach an outer diameter edge of the information layer, and wherein the masking device shields plasma generated by the metallizer from reaching internal components of the metallizer.

7. A system for manufacturing one or more of prerecorded optical discs, recordable optical discs, rewritable optical discs and hybrid optical discs, said system including the masking device of claim 6.

8. A masking device for use with a metallizer to form a reflective layer of an optical disc, the masking device including a pusher having a spring mechanism attached to an inner masking portion body of the masking device configured to shield an inner portion of a surface of the optical disc when the inner masking portion body sits on the inner portion of the surface of the disc during application of the reflective layer by the metallizer, wherein when the optical disc and the pusher are brought into relative contact with each other by application of a first force to at least one of the masking device and the optical disc towards the other, the pusher is pushed up into a recess of the inner masking portion body, creating a spring-loaded force in the spring mechanism, and wherein when the first force is removed, the spring-loaded force of the spring mechanism causes the pusher to push the optical disc away from the masking device.

9. The masking device of claim 8, wherein a lower portion of the pusher protrudes from an under side of the masking device body when the masking device is not resting on the surface of the optical disc.

10. A system for manufacturing one or more of prerecorded optical discs, recordable optical discs, rewritable optical discs and hybrid optical discs, said system including the masking device of claim 8.

11. An apparatus for forming a reflective layer of an optical disc, the apparatus comprising:
    a metallizer for applying the reflective layer of the optical disc; and
    a masking device including a pusher having a spring mechanism attached to an inner masking portion body of the masking device configured to shield an inner portion of a surface of the optical disc when the inner masking portion body sits on the inner portion of the surface of the optical disc during application of the reflective layer,
    wherein when the optical disc and the pusher are brought into relative contact with each other by application of a first force to at least one of the masking device and the optical disc towards the other, the pusher is pushed up into a recess of the inner masking portion body, creating a spring-loaded force in the spring mechanism, and
    wherein when the first force is removed, the spring-loaded force of the spring mechanism causes the pusher to push the optical disc away from the masking device.

12. The apparatus of claim 11, wherein a lower portion of the pusher protrudes from an under side of the masking device when the masking device is not resting on the surface of the optical disc.

13. A system for manufacturing one or more of prerecorded optical discs, recordable optical discs, rewritable optical discs and hybrid optical discs, said system including the apparatus of claim 11.

14. The apparatus of claim 11, wherein the inner masking portion body includes an inner angled lip.

15. The apparatus of claim 11, wherein the pusher is secured by a securing member to the inner masking portion body in a direction of the spring-loaded force.

16. The apparatus of claim 11, wherein the spring-loaded force overcomes sticking of the optical disc to the masking device.

17. The apparatus of claim 1, wherein the angled lip allows the reflective layer to reach an outer diameter edge of the optical disc.

18. The apparatus of claim 1, wherein the angled lip of the outer masking portion forms a seal between the optical disc and the outer masking portion, the seal restricting the plasma from reaching internal components of the metallizer.

19. The apparatus of claim 1, further comprising:
an inner masking device including a pusher having a spring mechanism attached to an inner masking portion body of the inner masking device configured to shield an inner portion of a surface of the optical disc when the inner masking portion body sits on the inner portion of the surface of the optical disc during application of the reflective layer,
wherein when the optical disc and the pusher are brought into relative contact with each other by application of a first force to at least one of the inner masking device and the optical disc towards the other, the pusher is pushed up into a recess of the inner masking portion body, creating a spring-loaded force,
wherein when the first force is removed, the spring-loaded force of the pusher pushes the optical disc away from the apparatus, and
wherein the outer masking portion body having the angled lip allows the reflective layer applied by the metallizer to reach an outer diameter edge of the information layer of the optical disc, and the outer masking device shields plasma generated by the metallizer from reaching internal components of the metallizer.

20. The apparatus of claim 19, wherein the outer masking device and the inner masking device are commonly attached to a frame.

\* \* \* \* \*